United States Patent
Okino et al.

[11] Patent Number: 6,072,184
[45] Date of Patent: Jun. 6, 2000

[54] CHARGED-PARTICLE-BEAM PROJECTION METHODS

[75] Inventors: Teruaki Okino, Kamakura; Shohei Suzuki, Tokyo, both of Japan

[73] Assignee: Nikon Corporation, Tokyo, Japan

[21] Appl. No.: 09/080,873

[22] Filed: May 18, 1998

[30] Foreign Application Priority Data

May 16, 1997 [JP] Japan .................................. 9-127541

[51] Int. Cl.[7] ................................................ H01J 37/304
[52] U.S. Cl. ...................................... 250/492.2; 250/491.1
[58] Field of Search ........................... 250/492.22, 492.2, 250/491.1, 398

[56] References Cited

U.S. PATENT DOCUMENTS 5,621,216   4/1997   Clarke et al. ...................... 250/492.22
5,912,467   6/1999   Okino .................................. 250/491.1

FOREIGN PATENT DOCUMENTS 61-283121   12/1986   Japan .
2-125609    5/1990    Japan .

*Primary Examiner*—Kiet T. Nguyen
*Attorney, Agent, or Firm*—Klarquist Sparkman Campbell Leigh & Whinston, LLP

[57] ABSTRACT

Methods are disclosed for improving the accuracy of pattern registration between various layers formed on a sensitive substrate by microlithography using a charged-particle beam, especially registration accuracy as affected by rotation of image portions relative to corresponding image portions in an earlier applied layer. Errors in rotational angle of a pattern transferred to the $n^{th}$ layer and the arrangement direction of the transferred pattern on the substrate are measured. During projection of the $(n+m)^{th}$ (e.g., the $(n+1)^{th}$) layer, the rotational angle of images that have passed through the mask subfields is corrected according to the measured rotational angle. Also, the deflection direction of the images on the substrate that have passed through the mask subfields is corrected according to the measured arrangement direction. The transfer subfields in the $(n+m)^{th}$ layer can be accurately stitched together and corresponding transferred pattern in the $n^{th}$ and $(n+m)^{th}$ layer can be accurately registered with respect to each other.

13 Claims, 5 Drawing Sheets

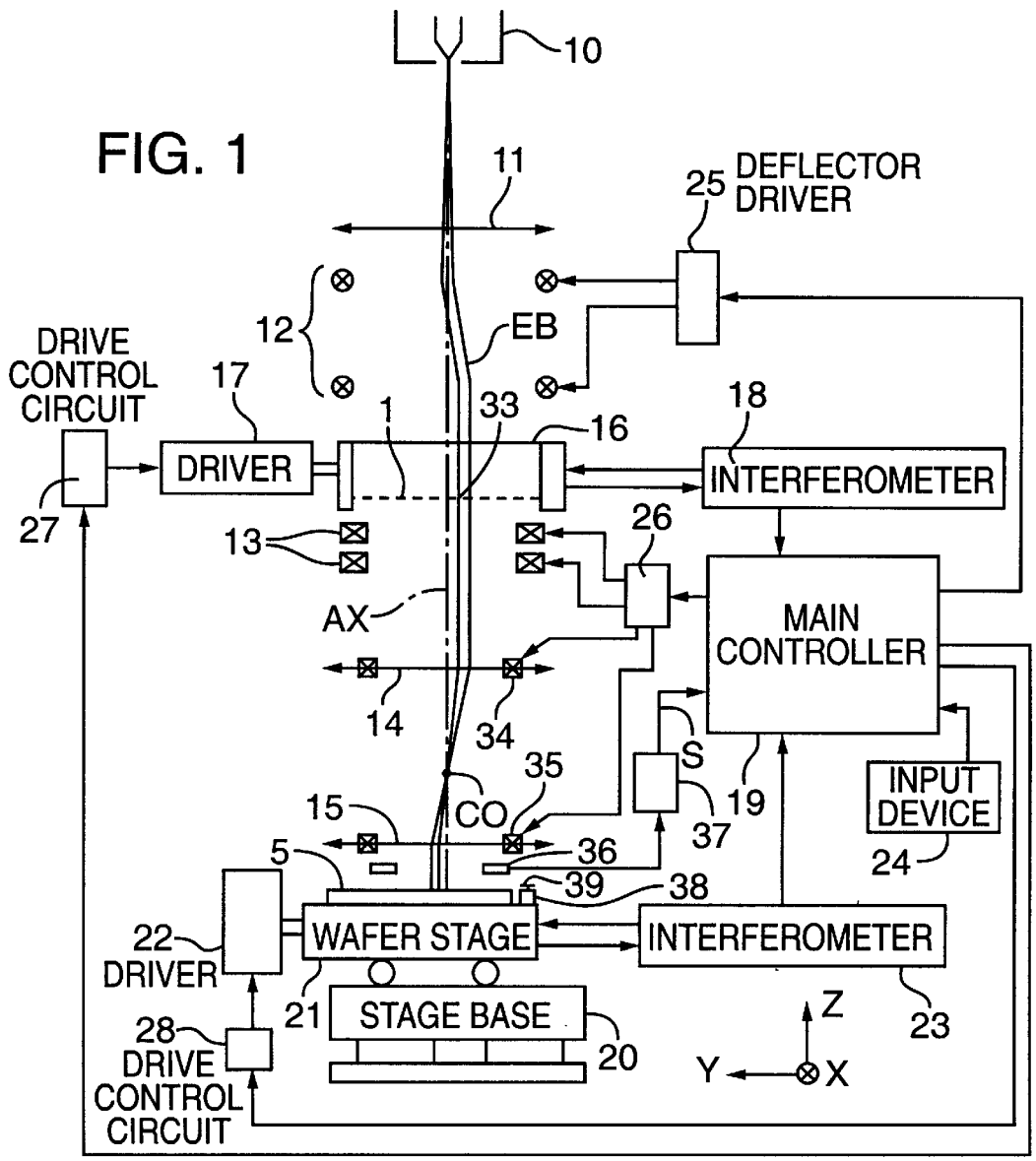

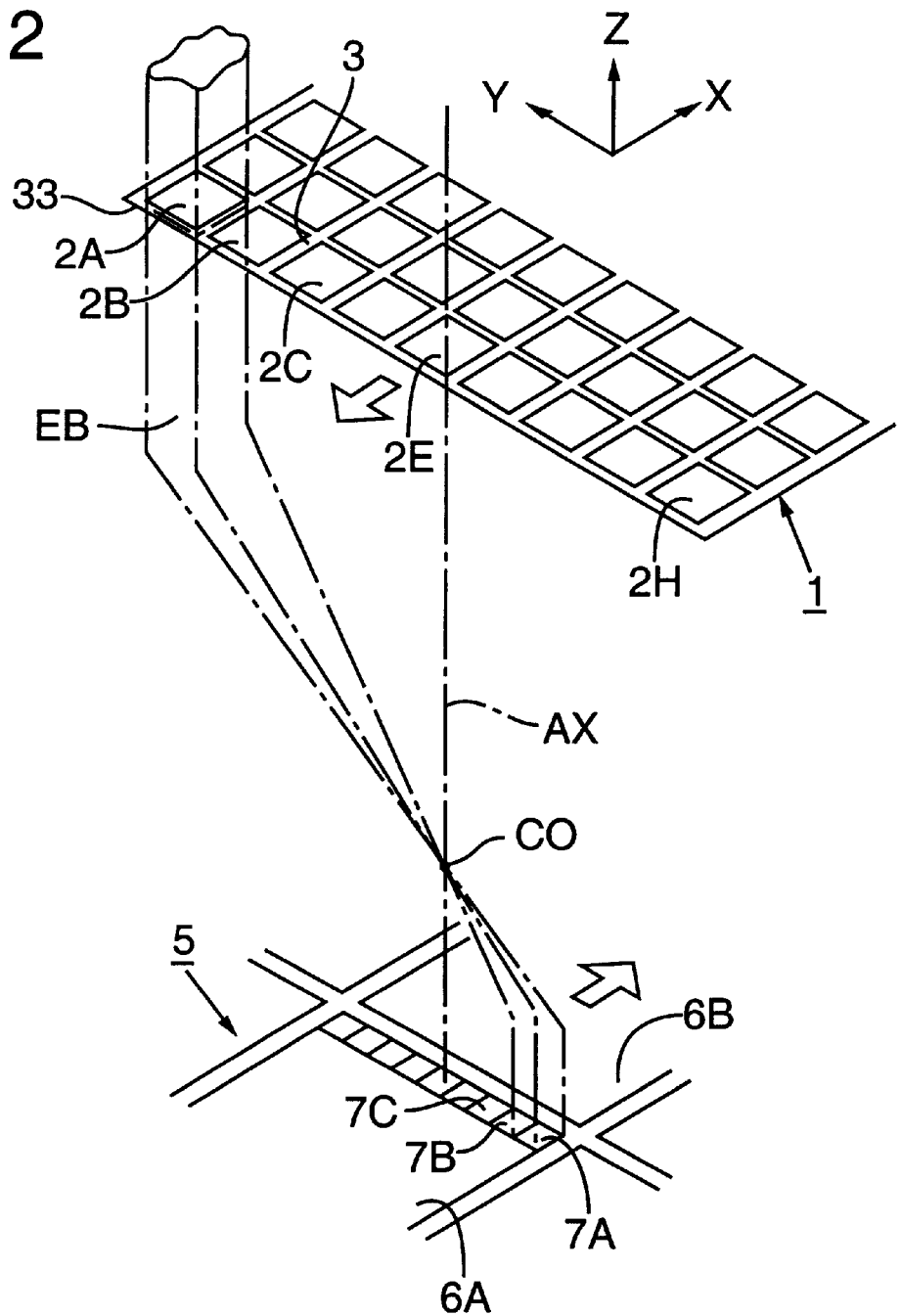

CHARGED-PARTICLE-BEAM PROJECTION METHODS

FIELD OF THE INVENTION

This invention pertains to microlithography using a charged-particle beam for projecting a pattern, defined by a mask or reticle, onto a sensitive substrate, as used for making semiconductor devices and displays.

BACKGROUND OF THE INVENTION

Much recent research has been dedicated to the development of a practical charged-particle-beam (CPB) exposure apparatus exhibiting high resolution and high throughput. One contemporary approach has been directed to batch systems that project at least one entire die in a single exposure (wherein a "die" is coextensive with an integrated circuit or display to be formed on a wafer or other suitable substrate. In many instances, the wafer accommodates multiple dies.) Unfortunately, it is difficult to prepare a "mask" (serving as a projection "master") suitable for use with a CPB batch projection-exposure system. Also, due to the relatively large field of view of the CPB projection-optical system used in such apparatus, it is difficult to maintain aberrations arising in the CPB projection-optical system at or below specifications.

Therefore, another contemporary approach utilizes a segmented mask in which a die is divided into multiple "mask subfields" that are individually projected onto corresponding "transfer subfields" on the sensitized substrate. Each die projected onto the substrate comprises multiple constituent transfer subfields that are "stitched" together. This approach is termed a "divided" projection-exposure apparatus. One advantage of the divided projection-exposure apparatus is that aberrations arising in the projection-optical system tend to be smaller due to the smaller field of view of the projection-optical system. Also, most divided projection-optical apparatus allow projection and exposure to be performed while certain aberrations are being corrected. For example, the focal position for each sub-field and distortion of the projected image can be individually adjusted for each mask subfield. Such aspects of divided projection-exposure apparatus allow exposures to be made with excellent resolution and positional accuracy across an optically wider area than realized with batch projection-exposure apparatus.

The pattern portion defined in each mask subfield is typically demagnified by the projection-optical system by a specified demagnification ratio. I.e., the image of each mask subfield projected onto the corresponding transfer subfield is reduced in size ("demagnified"), usually by an integer factor (e.g., 2, 4, or 5). Although the demagnification ratio is typically fixed at a nominal value, the demagnification ratio can change slightly over time as influenced by, e.g., changes in environmental conditions.

Changes in environmental conditions and/or prolonged use of a CPB exposure apparatus can also cause changes in aberrations exhibited by the projection-optical system. For example, an image formed on a transfer subfield can exhibit some degree of rotation relative to the orientation of the corresponding mask subfield. Also, loading a mask or wafer can introduce a rotational error or other alignment error of the pattern to be transferred, relative to the previously transferred patterns of existing layer(s) on the wafer. Such rotation errors can cause substantial difficulty in achieving satisfactory stitching together of the transfer subfields on the substrate and in achieving accurate registration of the various layers with each other.

Certain CPB projection-exposure apparatus have been proposed (e.g., in Japan Kôkai Patent Publication No. HEI 7-22349, and Japan Kôkai Patent Publication No. HEI 8-132987) that measure errors in the demagnification ratio and/or rotation of a projected mask-subfield image, and controllably reduce such errors. In such apparatus, the "seams" between adjacent transfer subfields of the same layer on the substrate can be accurately aligned. However, it is difficult with such apparatus to achieve a satisfactorily accurate alignment of features of a layer (e.g., a second layer) with features in an earlier-applied layer (e.g., a first layer) on the substrate (termed "overlay errors"). Whereas overlay errors do not pose serious problems when $5\text{-}\mu m^2$ subfields are projected onto the substrate, larger subfields (e.g., $250\text{-}\mu m^2$ subfields) can be problematic with respect to achieving a desired registration accuracy between, e.g., the second-layer pattern and the first-layer pattern.

SUMMARY OF THE INVENTION

In view of the foregoing, an object of the invention is to provide charged-particle-beam (CPB) projection-exposure methods by which improved registration accuracy can be achieved of the patterns in each layer applied to the sensitive substrate, especially registration accuracy as affected by rotational direction and image-alignment direction.

According to one aspect of the invention, improved microlithography processes that employ a charged-particle beam are provided. The charged-particle beam is passed sequentially through individual subfields of a segmented mask so as to projection-transfer a pattern defined by the mask subfield-by-subfield through a projection-optical system to form corresponding transfer subfields on a sensitive substrate. According to one exemplary embodiment, when projecting an image of a subfield of a segmented mask defining an $(n+m)^{th}$-layer pattern onto a corresponding transfer pattern of an $n^{th}$ layer on the sensitive substrate, the following are performed: (1) the rotational angle of the image of the $(n+m)^{th}$ layer is measured relative to the $n^{th}$-layer pattern, and (2) at least one of the following is corrected: (a) the rotational angle of the image of the mask subfield of the $(n+m)^{th}$ layer relative to the $n^{th}$ layer, and (b) the deflection direction of the image of the mask subfield of the $(n+m)^{th}$ layer relative to an orientation (arrangement direction) of the $n^{th}$-layer pattern.

According to another exemplary embodiment, a method is provided in which a segmented mask is provided in which a pattern defined by the mask is divided into multiple mask subfields. The subfields of the mask are sequentially irradiated using a charged-particle beam while moving the mask relative to the sensitive substrate. The charged-particle beam, after passing through each mask subfield, is projected onto a corresponding transferred pattern on the sensitive substrate. A yaw error accompanying the relative movement of the mask and substrate is measured. According to the measured yaw error, a direction of deflection of each mask-subfield image on the corresponding transferred pattern on the sensitive substrate is measured. A rotational angle of each mask-subfield image on the corresponding transferred pattern on the substrate can be corrected.

According to another representative embodiment, a microlithography process is provided in which a charged-particle beam is passed sequentially through individual subfields of a segmented mask so as to projection-transfer a pattern, defined by the mask mounted on a movable mask stage, subfield-by-subfield through a projection-optical system onto corresponding regions on a sensitive substrate mounted on a movable stage. A mask is provided that comprises multiple subfields each defining a respective portion of an overall $(n+1)^{th}$-layer pattern defined by the mask, boundary regions separating the subfields from each other, and a transmissive alignment mark. A substrate alignment mark is provided on at least one of the following: the substrate and the substrate stage. The substrate is moved as required to align the substrate alignment mark with an optical axis of the projection-optical system. The mask is moved as required to position the alignment mark on the mask sequentially on the optical axis and irradiating the positioned alignment mark onto the substrate alignment mark. A position error of an image of the mask alignment mark relative to the substrate alignment mark is measured. Any position error can be corrected before exposing a mask subfield using the charged-particle beam, wherein the correcting can be performed by deflecting the charged-particle beam.

In the above method, the substrate can be provided with multiple substrate/alignment marks, the image of a mask alignment mark can be irradiated on a substrate-alignment mark, and a relative rotation of the substrate alignment mark and the irradiated mask alignment mark can be measured. Also, an error of rotation of the substrate alignment mark can be corrected relative to the irradiated mask alignment mark. Such an error can be corrected by, e.g., deflecting the charged-particle beam or by moving the substrate stage.

According to another aspect of the invention, charged-particle-beam projection methods are provided. According to an exemplary embodiment of such methods, an $(n+m)^{th}$-layer segmented mask is provided in which a pattern defined by the mask is also divided into multiple mask subfields. The orientation of each of multiple transfer subfields of the $n^{th}$ layer on the sensitive substrate is measured. Then, the subfields of the $(n+m)^{th}$ layer are irradiated using the charged-particle beam. During such irradiation, the charged-particle beam, after passing through each mask subfield, is projected to form a corresponding $(n+m)^{th}$-layer transfer subfield on the sensitive substrate. As each transfer subfield of the $(n+m)^{th}$ layer is exposed, the deflection direction of the respective image of the corresponding $(n+m)^{th}$ mask subfield on the sensitive substrate is adjusted as required relative to the orientation of the image of the corresponding $n^{th}$ mask subfield at the corresponding transfer subfield in the $n^{th}$ layer.

According to another exemplary embodiment of the charged-particle-beam projection methods, an $(n+m)^{th}$-layer segmented mask is provided in which a pattern defined by the mask is divided into multiple mask subfields. The orientation of each of multiple transfer subfields of a previously applied $n^{th}$ layer on the sensitive substrate is measured. Then, the subfields of the $(n+m)^{th}$ layer are sequentially irradiated using the charged-particle beam. During such irradiation, the charged-particle beam, after passing through each mask subfield, is projected to form a corresponding $(n+m)^{th}$-layer transfer subfield on the sensitive substrate. As each transfer subfield of the $(n+m)^{th}$ layer is exposed, at least one of the following is adjusted as required relative to the measured orientation of the $n^{th}$ layer pattern: (1) the rotational angle of the respective image of the $(n+m)^{th}$ mask subfield on the sensitive substrate, and (2) the deflection direction of the respective image of the $(n+m)^{th}$ mask subfield on the sensitive substrate.

According to another aspect of the invention, charged-particle-beam projection methods are provided. In a preferred embodiment, a first step comprises providing a segmented mask in which a pattern defined by the mask is divided into multiple mask subfields. The subfields of the mask are sequentially irradiated using a charged-particle beam while moving the mask relative to a sensitive substrate. During such irradiation, the charged-particle beam, after passing through each mask subfield, is projected to form a corresponding transfer subfield on the sensitive substrate. The yaw error accompanying the relative movement of the mask and the sensitive substrate is measured. According to the measured yaw error, the direction of deflection of each mask-subfield image on the sensitive substrate is corrected. The measured yaw error can also be used to correct the rotational angle of each mask-subfield image on the sensitive substrate.

According to another aspect of the invention, improved masks are provided.

The foregoing and additional features and advantages of the invention will be more readily apparent from the following detailed description, which proceeds with reference to the accompanying drawings.

BRIEF DESCRIPTION OF THE DRAWINGS

FIG. 1 is an elevational schematic diagram showing the configuration of an example embodiment of an electron-beam projection-exposure apparatus according to the invention.

FIG. 2 is an oblique view showing representative mask subfields and transfer subfields, and general aspects of projection of a mask subfield to form the corresponding transfer subfield on the substrate.

DETAILED DESCRIPTION

Figure 3A:
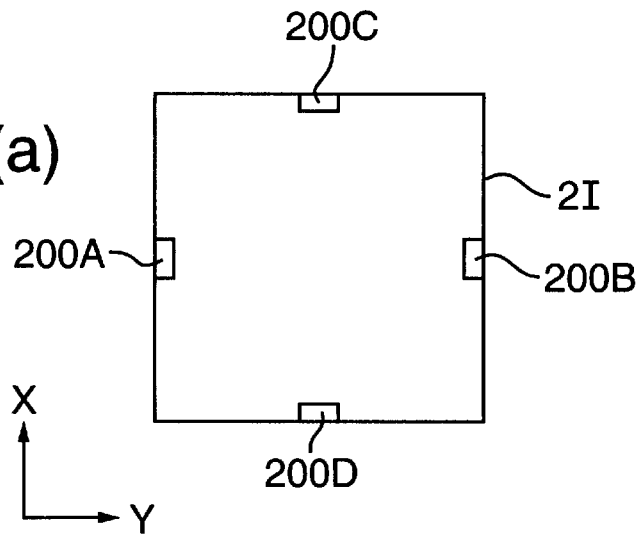
FIG. 3(a) is a plan view of transmission marks, located inside a mask subfield, and for performing measurements of the rotational angle (yaw) of the mask subfield.

The invention is described below in connection with multiple example embodiments that represent the current best mode of the invention. It will be understood that the invention is not limited to these specific embodiments.

Example Embodiment 1

FIG. 1 schematically shows an electron-beam (as a representative charged-particle beam) projection-exposure apparatus for projecting a pattern onto a sensitive substrate (e.g., a semiconductor wafer) according to this example embodiment. The FIG. 1 embodiment is termed a "demagnifying" projection-exposure apparatus because the image projected onto the substrate is smaller than the corresponding pattern on the mask. The FIG. 1 embodiment is described with a Z-axis parallel to an optical axis AX of the electron-optical system, an X-axis perpendicular to the plane of the page, and a Y-axis parallel to the plane of the page. The X-, Y-, and Z-axes are perpendicular to each other, and the X- and Y-axes define a plane perpendicular to the Z-axis.

An electron beam EB is emitted from an electron gun 10 and collimated by a condenser lens 11. The electron beam EB is deflected primarily in the Y-direction within the X-Y plane by a subfield-selection deflector 12, made from a two-stage electromagnetic deflector or electrostatic deflector, that guides the electron beam EB to an illumination field 33 of a subfield on the mask 1. The subfield-selection deflector 12 is connected to a main controller 19 that generally controls the overall operation of the FIG. 1 apparatus. Specifically, the main controller 19 determines, inter alia, the magnitude of the deflection imparted to the electron beam EB by the subfield-selection deflector 12. To such end, the main controller 19 delivers a control signal to a deflector driver 25.

The mask 1 is divided into multiple mask subfields 2A, 2B, 2C, . . . . Each mask subfield defines a respective portion of the overall mask pattern. As shown, e.g., in FIG. 2, each of the mask subfields 2A, 2B, 2C, . . . , is sequentially illuminated by the electron beam EB controllably deflected by the subfield-selection deflector 12. The respective pattern portion defined in each mask subfield 2A, 2B, 2C, . . . , is thus projected onto a corresponding transfer subfield 7A, 7B, 7C, . . . , in a chip field ("die") 6A on a sensitive substrate ("wafer") 5. The various mask subfields 2A, 2B, 2C, . . . , are separated from one another by boundary regions 3.

The mask also comprises a "measurement" mask subfield 2I that is preferably separate from the subfields defining portions of the actual mask pattern. The measurement subfield 2I of FIG. 3(a) includes transmissive rotational-angle-measurement marks 200A, 200B, 200C, 200D used for measuring the rotational angle of the mask subfield projection image relative to the respective transfer subfield. Each of the rotational-angle-measurement marks 200A–200D is situated at the center of a respective side of the measurement subfield 2I.

Figure 3B:
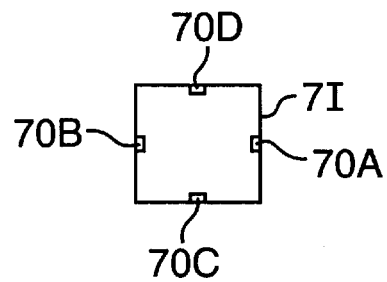
FIG. 3(b) is a plan view of rotational-angle measurement marks, corresponding to the marks shown in FIG. 3(a), located inside a transfer subfield on the substrate.

FIG. 3(b) shows the corresponding "measurement" subfield 7I on the sensitive substrate. The measurement subfield 7I includes rotational-angle-measurement marks 70A, 70B, 70C, 70D, corresponding to the rotational-angle-measurement marks 200A–200D, and each situated at the center of a respective side of the measurement subfield 7I. Two rotational-angle-measurement marks 200A and 200B are situated a specified distance apart along a line parallel with the Y-axis, while the remaining two rotational-angle-measurement marks 200C and 200D are situated a specified distance apart along a line parallel with the X-axis. Each mark 70A–70D can be a groove mark, a protrusion mark, or configured with a coating of a thin film of a heavy metal.

Figure 4A:
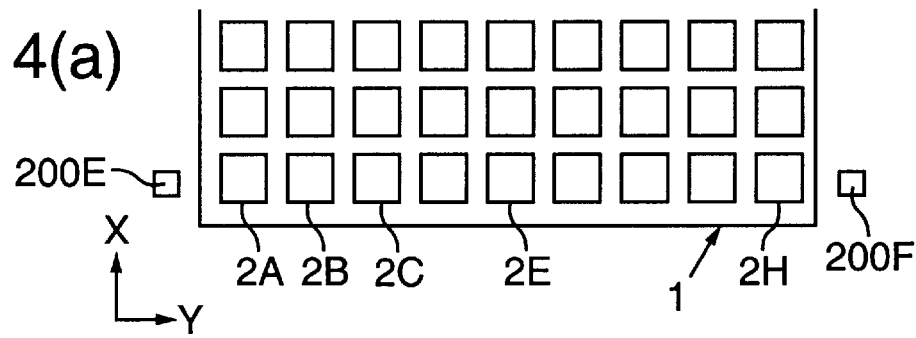
FIG. 4(a) is a plan view of transmission marks, used for measuring subfield alignment, that are situated outside the optical field on the mask.

As shown in FIG. 4(a), transmissive alignment-direction-measurement marks 200E, 200F are situated on the mask 1 preferably outside the pattern area. The marks 200E, 200F (and the marks 70E, 70F discussed below) are used for measuring errors in arrangement direction (orientation) between the mask and the wafer.

Figure 4B:
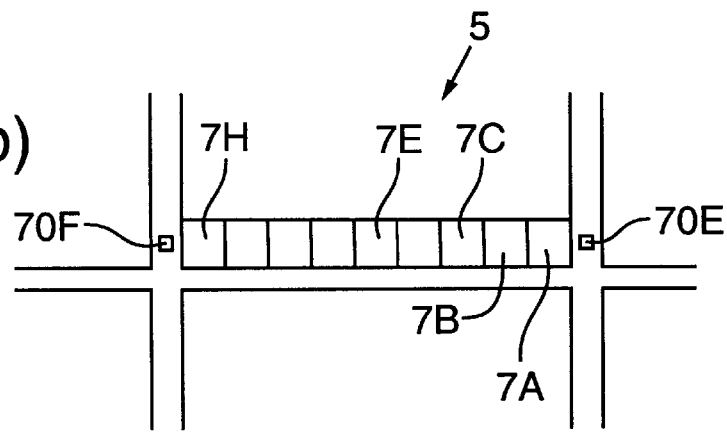
FIG. 4(b) is a plan view of subfield-alignment-measurement marks, corresponding to the marks shown in FIG. 4(a), located on the substrate.

The alignment-direction-measurement marks 70E, 70F, corresponding with the respective alignment-direction-measurement marks 200E, 200F are situated preferably outside the pattern area on the wafer 5, as shown in FIG. 4(b). Each alignment-direction-measurement mark 70E, 70F can be a groove mark, a protrusion mark, or configured with a coating of a thin film of a heavy metal. The marks 70E, 70F are preferably transferred to the wafer by a previous exposure (e.g., by exposing a prior mask) and are formed by, e.g., etching or a metal-coating process.

In FIG. 1, the electron beam EB that has passed through the mask 1 is deflected a specified amount by a two-stage deflector 13 and then guided to a projection lens 14. A crossover image CO is formed by the projection lens 14, and an image of the illuminated region of the mask is formed by the projection lens 14 and an objective lens 15 at a specified demagnification ratio (e.g., ¼) at a specified location on the wafer 5. The main controller 19 controllably sets the magnitude of the deflection imparted by the deflector 13. To such end, the main controller 19 delivers an appropriate signal to a deflector driver 26.

As shown in FIG. 2, the mask subfields on the mask 1 are individually flanked by boundary regions 3; however, it is desired that boundary regions not appear between the images at the corresponding transfer subfields on the wafer 5. I.e., the images at the transfer subfields are "stitched together" so as ideally to be contiguous without any intervening spaces. Between the mask and the wafer, deflection of the electron beam EB sufficient to stitch the transfer subfields together is effected by the deflector 13. The deflector 13 is also used to correct any synchronous-movement errors of the mask 1 and wafer 5 relative to each other and/or to correct the arrangement direction (orientation) of the mask subfield images, as will be described later. The deflector 13 can be an electromagnetic deflector, an electrostatic deflector, or a combination of an electromagnetic deflector and an electrostatic deflector.

A respective correcting lens 34, 35 is preferably situated within the projection lens 14 and the objective lens 15, respectively, to apply any necessary correction to the rotational angle of the projection image. The required amount of rotational-angle correction applied by the correcting lenses 34 and 35 is determined by the main controller 19. A respective control signal is generated by the main controller 19 and delivered to the deflector driver 26. The correcting lenses 34, 35 can each be a wound hollow-core coil or the like. The correcting lenses 34, 35 change the rotational angle by a change in the electrical excitation of the correcting lenses.

The correcting lenses 34, 35 need not be located within the respective projection lens 14 and objective lens 15. Locations not within the lenses 14, 15 can also be used. Also, whereas two correcting lenses 34, 35 are shown, three such lenses (not shown) are preferable to achieve superior compensation of focus changes and magnification changes.

A backscattered-electron detector 36 is situated downstream of the objective lens 15 in order to detect electrons that are backscattered from the surface of the wafer. A corresponding output signal from the backscattered-electron detector 36 is processed by a signal-processing circuit 37 to produce a backscattered-electron signal S. The backscattered-electron signal S is delivered to the main controller 19. In this example embodiment, the backscattered-electron signal S has a characteristic that is a function of the positions of the rotational-angle-measurement marks and/or the alignment-direction-measurement marks, as will be described below.

For use, the mask 1 is placed on a mask stage 16. During actual pattern transfer, the mask stage 16 is moved continuously along the X-axis and step-wise along the Y-axis by a stage driver 17. The Y-coordinate position of the mask stage 16 is detected by a laser interferometer 18 that produces a respective signal output to the main controller 19. The X-coordinate position of the mask stage 16 is measured by a separate laser interferometer (not shown).

The surface of the wafer 5 is normally coated with a suitable CPB-sensitive resist and is placed on a wafer stage 21 movably mounted on a stage base 20. The wafer stage 21 can be continuously moved along the X-axis by a respective stage driver 22 in a direction opposite the continuous-movement direction of the mask stage 16 along the X-axis. The wafer stage 21 and mask stage 16 undergo continuous movement in opposite directions because the mask-pattern image is inverted by the projection lens 14 and the objective lens 15. The Y-coordinate position of the wafer stage 21 is detected by a laser interferometer 23 that outputs a signal to the main controller 19. The X-coordinate position of the wafer stage 21 is measured by a laser interferometer (not shown).

The main controller 19 calculates the desired magnitude by which the electron beam EB is to be deflected by the subfield-selection deflector 12 and by the deflector 13. The main controller 19 also calculates data necessary to control operation (e.g. determine position and velocity) of the mask stage 16 and the wafer stage 21, based upon exposure data provided by an input device 24 and upon data from the laser interferometers 18, 23 (as well as other laser interferometers) concerning the position of the mask stage 16 and the wafer stage 21, respectively. Calculation results obtained by the main controller 19 are output to the deflector drivers 25, 26 that energize the respective deflectors 12, 13 sufficiently to achieve the desired magnitude of deflection of the electron beam EB. The calculation results related to the operation of the stages 16, 21 are output to respective drive-control circuits 27, 28 that controllably energize the respective drivers 17, 22 so that the respective stages 16, 21 operate according to the calculation results.

The input device 24 can comprise a device that "reads" magnetic data previously stored on a magnetic medium and/or a device that "reads" exposure data registered on the mask 1 or wafer 5 at time of loading the mask and/or wafer on the respective stages 16, 21. The input device 24 can also comprise a data-entry device such as a keyboard manipulated by an operator. The main controller 19 also provides instructions to various components of the apparatus to correct imaging characteristics of the apparatus or to correct the rotational angle of the image as necessary. Such components include the deflector drivers 25, 26 and the correcting lenses 34, 35.

The FIG. 1 apparatus operates as follows. The electron gun 10 produces an electron beam EB and shapes the electron beam EB typically to a square profile transverse to the optical axis AX. The electron beam EB is then deflected a specified magnitude from the optical axis AX by the subfield-selection deflector 12 to a desired mask subfield 2A on the mask 1 (FIG. 2). As the electron beam EB irradiates the selected mask subfield 2A, electrons passing through the electron-transmissive portions of the pattern portion defined by the selected mask subfield are projected at a specified demagnification ratio (e.g., ¼) by the projection lens 14 and the objective lens 15 to form a corresponding transfer subfield 7A on the wafer 5 (FIG. 2). To complete projection of the entire die pattern, the remaining mask subfields 2B, 2C, . . . are individually irradiated in a sequential manner by the electron beam EB to project an image of each irradiated mask subfield and form a corresponding transfer subfield 7B, 7C, . . . . During such projection, the electron beam is focused by the projection lens 14 and the objective lens 15 and deflected as required by the deflector 13 to stitch together the transfer subfields and thus form the entire die (reduced in size by the demagnification ratio) on the wafer 5. If the electron beam EB were not deflected as noted above by the deflector 13, then electrons passing through each mask subfield would form an image on the wafer 5 of not only the particular irradiated mask subfield but also the boundary region, resulting in the imprinting on the wafer of transfer subfields separated from one another by unexposed boundary regions. Appropriate shifting of the electron beam by the deflector 13 eliminates such unexposed regions between the transfer subfields.

As the electron beam EB is shifted in the Y direction as described above, the mask stage 16 is continuously moved in the −X direction at a velocity $V_M$ while the wafer stage 21 is continuously moved in the +X direction at a velocity $V_W$ in synchrony with the movement of the mask stage 16. The velocities $V_M$ and $V_W$ have the relationship expressed in Equation (1):

$$V_W = \beta[L_1/(L_1+L_2)]V_M \quad (1)$$

wherein $\beta$ is the demagnification ratio, $L_1$ is the width of the mask subfield in the X direction, and $L_2$ is the width of the boundary region 3 in the X direction.

Normally, as shown in FIG. 2, mask subfields are arranged sequentially (e.g., mask subfields 2A, 2B, . . . ) in rows extending in the Y direction. The rows are arranged sequentially in the X direction and grouped into "stripes" each containing one or more adjacent rows of subfields, wherein one die of mask subfields contains one or more stripes of mask subfields. For projection of a particular row of mask subfields, the mask stage 16 is moved in the X direction until the desired row nearly intersects the optical axis AX; similarly, the wafer stage 21 is moved in the X direction until the side of the corresponding row nearly intersects the optical axis AX. Irradiation of the mask subfields in the selected row is performed by appropriately deflecting the electron beam EB in the Y direction (and also slightly in the X direction) using the subfield-selection deflector 12. Because the mask subfields move in the X direction as each row of mask subfields is projected, the X position of each subfield changes sequentially subfield-by-subfield. The respective pattern portion defined by each mask subfield in the selected row is sequentially projected, using the deflector 13, to form each respective transfer subfield (e.g., transfer subfields 7A, 7B, . . . ) in the selected row in a "chip field" (die) 6A on the wafer. After all the subfields in a first stripe are exposed, the mask 1 and wafer 5 are moved stepwise in the X direction to position the respective second stripe such that the optical axis AX intersects the side of the second stripe on both the mask 1 and the wafer 5. Then, the subfields in the second stripe are sequentially exposed, and so on as required to complete exposure of the entire die 6A. Projection of each mask subfield of a die is performed while correcting aberrations such as focal position and distortion. After all subfields in a die are exposed, the entire sequence is repeated for the next die (usually adjacent to the just-exposed die) on the wafer 5.

Next, with respect to this example embodiment, the measurement of rotational error of the subfield image of the $(n+1)^{th}$-layer mask pattern relative to the $n^{th}$-layer transferred pattern, measurement of the foregoing rotational error, and examples of the correction operations which use said measurement values during projection of the (n+1)$^{th}$ layer pattern will be explained.

First, prior to projection and exposure of the (n+1)$^{th}$ layer, any rotational error is measured between the measurement subfield, in the n$^{th}$-layer transfer subfields, and the corresponding electron-beam image of the measurement mask subfield on the mask. Also, the arrangement direction (orientation) of the various n$^{th}$-layer transfer subfields is measured. The rotational angle of the transmitted mask image is adjustable as required by the correcting lenses 34, 35, and the deflection direction of the transmitted mask image is adjustable by the deflector 13.

Figure 8:
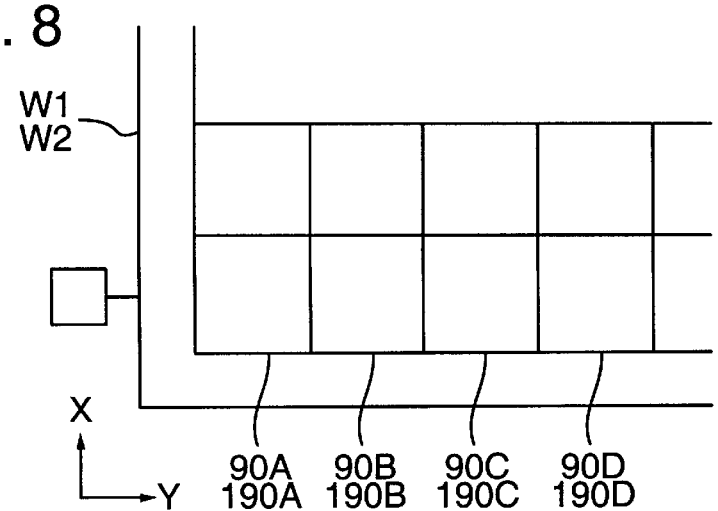
FIG. 8 illustrates the registration of the pattern of a first layer and the pattern of a second layer when the rotational angle and deflection direction are corrected according to the invention.

By adjusting and controlling the rotation of the projected subfield images of the (n+1)$^{th}$ layer relative to the projected subfield images of the n$^{th}$ layer, and by adjusting and controlling the deflection direction of each transmitted mask-subfield image in correspondence with the measured arrangement direction (orientation), the transfer subfields 190A, 190B, 190C, . . . of the (n+1)$^{th}$ layer can be accurately stitched together (FIG. 8). Also, the transfer subfields of the (n+1)$^{th}$ layer can be accurately overlaid on the respective transfer subfields 90A, 90B, 90C, . . . of the n$^{th}$ layer.

As shown in FIG. 3 (a), the measurement marks 200A–200D are preferably configured as through-holes aligned with the respective sides of the measurement subfield 2I on the mask. The mask stage 16 in FIG. 1 is driven appropriately to situate the center of the measurement subfield 2I at or nearly at the optical axis AX; the wafer stage 21 is driven to situate the center of the measurement subfield 7I, corresponding to the measurement subfield 2I, at or nearly at the optical axis AX. The electron beam EB is irradiated on the measurement subfield 2I, and a demagnified image of the pattern of the measurement marks 200A–200D in the measurement subfield 2I is projected through the projection lens 14 and the objective lens 15 onto the measurement subfield 7I.

Figure 5A:
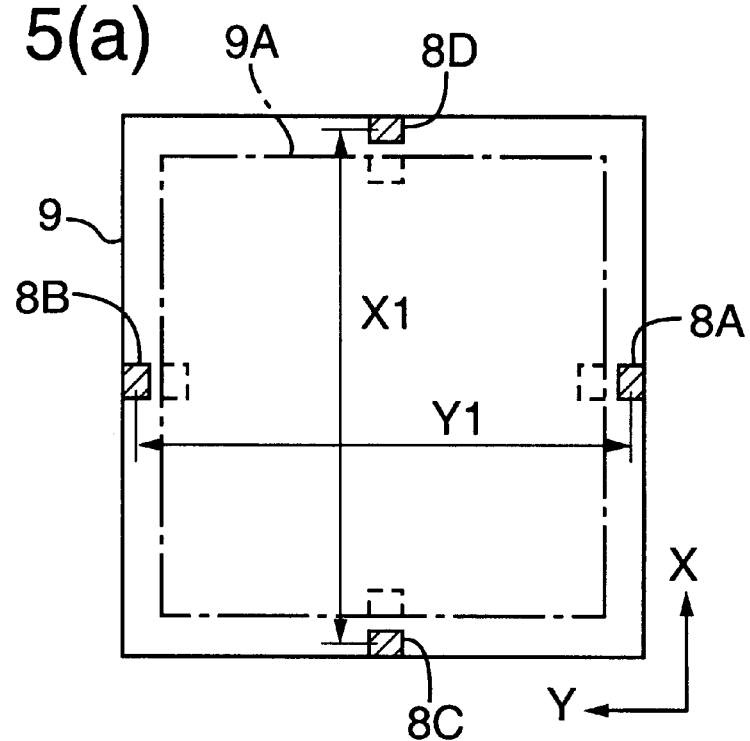
FIG. 5(a) is a plan view showing the projection of transmission marks, situated inside the mask subfield, onto the sensitive substrate for measuring the demagnification ratio of the CPB optical system.
Figure 5B:
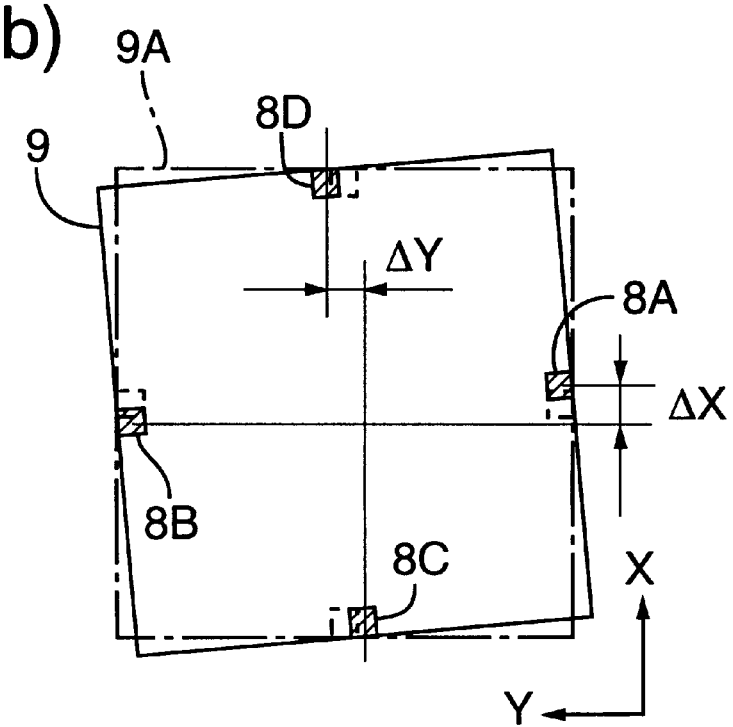
FIG. 5(b) is a plan view showing the projection of transmission marks, situated inside the mask subfield, onto the sensitive substrate for measuring the rotational angle of the projected pattern.

FIGS. 5(a) and 5(b) show the demagnified projected image 9 of the measurement subfield 2I. The mark images 8A–8D are correspondingly demagnified images of the measurement marks 200A–200D. As projected, each mark image 8A–8D touches a respective side of the projected image 9. The positions of the mark image 8A relative to the measurement mark 70A, the mark image 8B relative to the measurement mark 70B, the mark image 8C relative to the measurement mark 70C, and the mark image 8D relative to the measurement mark 70D are measured by a so-called "mark-detection method" by individually irradiating the electron beam onto each mark image 8A–8D, as described below.

An error in the demagnification ratio and/or rotational angle in the projected image 9 is manifest as a shift of the positional relationships of the mark images 8A–8D inside the projected image 9, relative to the respective measurement marks 70A–70D.

FIG. 5(a) shows an instance in which the projected image 9 exhibits an error in the demagnification ratio β but no error in rotation. The image 9A delineated by the dashed lines represents an ideal situation in which no error of demagnification ratio or rotational angle exists. With respect to the projected image 9, position differences between the marks 70A and 8A, the marks 70B and 8B, the marks 70C and 8C, and the marks 70D and 8D are measured, and the Y-axis distance Y1 between the two mark images 8A, 8B and the X-axis distance X1 between the two mark images 8C, 8D are determined. (The distances between adjacent marks are known, as previously measured, e.g., by another method.) The Y-direction demagnification ratio $\beta_Y$ and the X-direction demagnification ratio $\beta_X$ are calculated by dividing each of the distances Y1, X1, respectively, by the corresponding distances between the measurement marks 70A–70B and 70C–70D, respectively. The respective demagnification-ratio errors are determined by subtracting the nominal demagnification ratio $\beta_0$ from the calculated demagnification ratios $\beta_Y$ and $\beta_X$.

FIG. 5(b) shows an instance in which the projected image 9 exhibits a rotational-angle error but no demagnification-ratio error relative to the ideal image 9A. As in FIG. 5(a), the ideal projected image 9A (delineated by the dashed lines) in FIG. 5(b) represents a situation in which no error of demagnification ratio or rotational angle exists. In FIG. 5(b), the projected image 9 (delineated by the solid lines) is rotated relative to the ideal projected image 9A. The position differences between the marks 70A and 8A, the marks 70B and 8B, the marks 70C and 8C, and the marks 70D and 8D are measured, and the amount of positional shift ΔX in the X direction of the center of the mark image 8A relative to the mark image 8B (situated along the Y axis), and the amount of positional shift ΔY in the Y direction of the center of the mark image 8C relative to the mark image 8D (situated along the X axis) are determined. The Y-axis rotational angle θY is determined by dividing the positional shift ΔX by the Y-direction distance between the two mark images 8A and 8B, and the X-axis rotational angle θX is determined by dividing the positional shift ΔY by the X-direction distance between the two mark images 8C and 8D. The rotational-angle error for each axis is found by subtracting the nominal (ideal) rotational angle from the measured actual rotational angles θY and θX. Normally, marks transferred to the substrate during exposure of the previous layer are assumed to be "ideal". Any deviations from ideal can be determined by other methods. The orthogonality error in the projected image is calculated as the difference between the rotational angles θX and θY.

Thus, in this example embodiment, the error in the rotational angle of the projected image 9 is determined by measuring a distance in the Y direction (or X direction), and the positional shift in the X direction (or Y direction), between two of the four mark images 8A–8D, respectively. The procedure for measuring the distance Y1 in the Y direction of the center of two mark images 8A, 8B is explained below as an example.

First, as shown in FIG. 5(a), the projection image 9 of the measurement subfield 2I on the mask 1 is projected into the corresponding transfer subfield 7I centered on or nearly on the optical axis AX. (The transfer subfield 7I and the marks 70A–70D preferably were formed during exposure of the previous layer.) In such an arrangement, the electron beam that has passed through the measurement mark 200A (on the mask for the present layer) in the measurement subfield 2I is deflected by the deflector 13 to scan the corresponding measurement mark 70A on the wafer. Electrons backscattered from the mark 70A are detected by the backscattered-electron detector 36. The resulting detection signal is processed by the signal-processing circuit 37 which delivers a corresponding backscattered-electron signal S to the main controller 19. While the image of the mark 200A is being scanned, the irradiation position of the electron beam on the mask is preferably controlled so that the other marks 200B–200D are not irradiated by the electron beam. Similarly, when each of the other marks 200B–200D is scanned, none of the other marks is irradiated.

Figure 6:
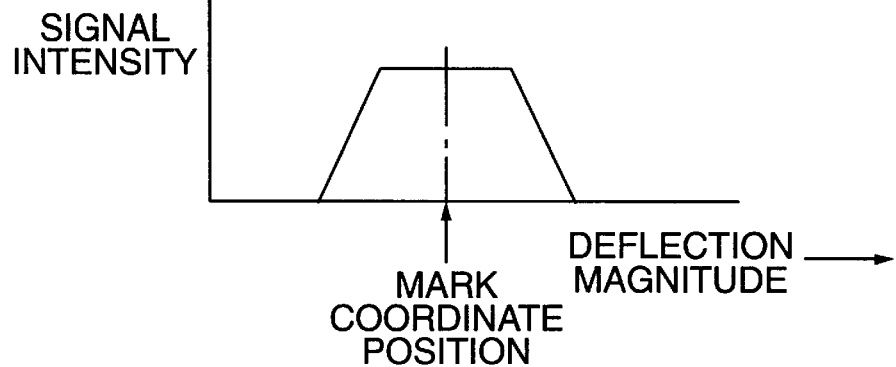
FIG. 6 shows a representative signal waveform produced by a detector used for detecting electrons backscattered from a mark on the wafer.

FIG. 6 shows a representative waveform of the backscattered-electron signal S. The horizontal axis denotes the magnitude of deflection of the electron beam and the vertical axis denotes signal intensity. The relative positions of the mark image 8A and the corresponding measurement mark 70A can be measured from the stage positions detected by the interferometers and the magnitude of deflection of the electron beam at the center of the signal-intensity distribution.

Similarly, the electron-beam image of the measurement mark 200B in the measurement subfield 2I scans the measurement mark 70B in the measurement transfer subfield 7I, the electron-beam image of the mark 200C scans the mark 70C, and the electron-beam image of the mark 200D scans the mark 70D. The relative positions of the mark image 8A versus the mark 70A, the mark image 8B versus the mark 70B, the mark image 8C versus the mark 70C, and the mark image 8D versus the mark 70D are determined as described above. The main controller 19 then calculates the rotational angle based on these positional measurement values.

Figure 7:
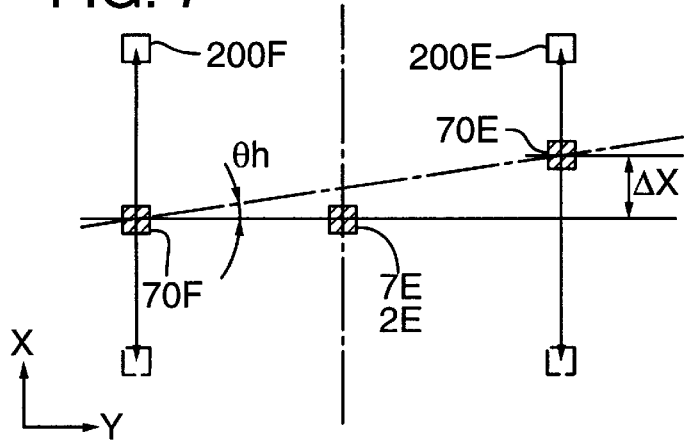
FIG. 7 illustrates the measurement of the arrangement direction (orientation) of a pattern transferred onto a first layer on the substrate.

Measurement of deflection direction is performed as follows. First, as shown in FIG. 7, the measurement marks 200E, 200F are situated (as described above in connection with FIG. 4(*a*)) outside the mask-pattern area but in the vicinity of the mask subfields 2A and 2H, respectively, that are most distant from the optical axis within the range of the optical field. To perform the measurement, the mask subfield 2E (as a representative "middle" mask subfield) is positioned nearly on the optical axis and the corresponding transfer subfield 7E is positioned nearly on the optical axis. The electron beam is then irradiated on the measurement mark 200E using the subfield-selection deflector 12. The beam, which has passed through the mark 200E, is scanned on the corresponding measurement mark 70E on the wafer in the X direction using the deflector 13. Next, the electron beam is irradiated on the measurement mark 200F using the subfield-selection deflector 12, and the beam which has passed through the mark 200F is scanned on the corresponding measurement mark 70F on the wafer, in the X direction using the deflector 13. Electrons backscattered from the marks 70E, 70F are detected by the backscattered-electron detector 36; the detection signal generated by the backscattered-electron detector 36 is processed by the signal-processing circuit 37 which sends a corresponding backscattered-electron signal S to the main controller 19. The waveform of the backscattered-electron signal S (FIG. 6) is used to measure the X-coordinate positions of the image of the measurement mark 200E relative to the measurement mark 70E, and of the image of the mark 200F relative to the mark 70F. The deflection direction $\theta h$ is calculated from the Y-direction distance and the X-direction distance between the measurement marks 70E and 70F.

Measuring the rotational angle and deflection direction of an $n^{th}$ layer and making necessary corrections during projection of an $(n+1)^{th}$ layer, according to the measurement results, are performed as follows. Prior to transferring the $n^{th}$-layer pattern, the mask 1 and wafer 5 are aligned with each other using alignment marks on the mask and on the wafer. (These mark positions are measured on the optical axis using optical alignment sensors.) After alignment is completed, the various subfield patterns on the $n^{th}$-layer mask are projected onto the wafer, as described above, to expose the resist on the wafer. The wafer is processed. Afterward, the resist-coated wafer is re-mounted to the wafer stage and the mask for the $(n+1)^{th}$ layer is mounted to the mask stage.

Prior to exposing the $(n+1)^{th}$-layer pattern, the mask and wafer are aligned with each other as with the $n^{th}$ layer of the wafer. Any rotational error of an image of an $(n+1)^{th}$-layer mask subfield projected on the respective $n^{th}$-layer transfer subfield and the arrangement direction (orientation) of the $(n+1)^{th}$-layer transfer subfield relative to the respective $n^{th}$-layer transfer subfield are measured as described above. When projecting a subfield of the $(n+1)^{th}$ layer, the correcting lenses 34, 35 are driven so as to correct the measured error in the rotational angle. Also, the deflection direction of the transmitted electron-beam image of the mask subfield is adjusted by the deflector 13 so as to align the image to the observed pattern-arrangement direction.

In the foregoing discussion, corrections were made based on the results of measuring the $(n+1)^{th}$-layer pattern against the $n^{th}$-layer pattern. However, it will be understood that corrections also can be made based on measurement results obtained from any subsequently applied layer pattern compared to an earlier-applied layer pattern. Whereas, in the foregoing, both the rotational angle and the arrangement direction (orientation) of the image were measured and corrections made based on the various measurement results, it is possible to, e.g., measure only the rotational angle and correct the rotation direction and arrangement direction of the image based on the one measurement.

Whenever the rotational-angle error of an image is small, similar results as described in this example embodiment can be obtained by measuring only the arrangement direction of multiple transfer subfields in the $n^{th}$ layer of the wafer 5 and then correcting the deflection direction on the wafer of the various images that have passed through the corresponding mask subfields during projection of the $(n+1)^{th}$ layer based on the measured arrangement direction.

Furthermore, similar results as described in this example embodiment can be obtained by measuring (using deflection) only the arrangement direction of multiple transfer subfields in the $n^{th}$ layer of the sensitive substrate 5 and then correcting the rotational angle of the image, that has passed through the corresponding mask subfields, and correcting the deflection direction on the sensitive substrate of the various images that have passed through the corresponding mask subfields during projection of the $(n+1)^{th}$ layer based on the measured arrangement direction.

An alternative method can be used to measure errors of subfield-image rotation and the deflection direction of the $n^{th}$ layer. To obtain an image of the $(n+1)^{th}$ layer rotation, use plural alignment marks on the mask and one mark on the wafer (or a fiducial mark on the wafer stage) are used. The wafer mark is positioned on the optical axis, and each mark on the mask is positioned sequentially on the optical axis. By moving the mask stage, each image of the mask mark is projected onto the wafer, and the position error between the image and the wafer mark is measured using the mark detection method described above. To obtain the rotation of the $n^{th}$ layer of the wafer, plural alignment marks on the wafer are used together with one mark on the mask or a fiducial mark on the mask stage. The position error between the image of the mask mark and each wafer mark is measured similarly to the foregoing method (but by moving the wafer stage rather than the mask stage). By these measurements, the relative rotation of the mask and wafer is obtained, and the subfield image rotation and deflection direction are corrected according to this measured value.

Example Embodiment 2

In this example embodiment, the yaw error of the mask stage 16 is measured during movement of the mask 1, and the yaw error of the wafer stage 21 is measured during movement of the wafer 5. The arrangement direction (orientation) of an image of a mask subfield is corrected by correcting the deflection direction of the electron beam, based on the measured yaw, using at least the deflector 13.

Furthermore, not only the deflection direction of the electron beam, but also the rotational angle of the image can also be corrected, by conventional beam deflection, based upon the measured yaw error. The yaw error of the mask stage 16 and/or the wafer stage 21 can be measured using multiple parallel laser interferometers arranged so as to measure the same directional movement of the stage.

Rotational-angle correction or deflection-direction correction based on yaw error is performed as follows. First, the yaw error of the mask stage 16 and of the wafer stage are measured in the scanning direction of the respective stage. (This measurement is performed by the multiple interferometers provided for measuring yaw, as described above. If the distance measurement obtained by each interferometer is different, then yaw is evident.) If the yaw error of the mask stage 16 is denoted $Y_{ME}$, and the yaw error of the wafer stage 21 is denoted $Y_{WE}$, then the difference $\Delta e$ is found between the yaw errors $Y_{ME}$ and $Y_{WE}$. The magnitudes of rotational-angle correction and deflection-direction correction required to obtain a required degree of registration of the images are calculated based on this difference $\Delta e$. When $\Delta e$ is small, only the deflection direction is typically corrected, while the rotation direction is not corrected (because correction during exposure is available, and the error magnitudes are different). When $\Delta e$ is large, both the deflection direction and the rotation direction are preferably corrected. When the rotational angle is small relative to the magnitude of electron-beam deflection, there is little effect on "seam error" between adjacent transfer subfields. As the rotational angle is increased, the effect on the seam error becomes substantial. Consequently, $\Delta e$ can be compared with a specified reference value (design value) to determine whether to correct only the deflection direction or to correct both the deflection direction and the rotational angle. In Example Embodiments 1 and 2, if both such corrections are made, then the seam error and overlay error of the image can be improved with even greater accuracy.

Thus, the rotational angle of a pattern portion transferred to the $n^{th}$ layer on the wafer 5 is measured; when projecting an $(n+m)^{th}$ layer, the rotational angle of the image passing through the subfield of the $(n+m)^{th}$ mask is measured. The deflection direction of the respective image on the wafer can be corrected according to the measured rotational angle. Also, the transfer subfields of the $(n+m)^{th}$ layer can be properly joined together, and proper registration of the $(n+m)^{th}$ layer with the $n^{th}$ layer is achieved.

Since the rotational angles of the pattern portions transferred to the $n^{th}$ layer of the wafer 5 are measured, the arrangement direction of each of the multiple transfer subfields in the $n^{th}$ layer is measured. When projecting a mask subfield in an $(n+m)^{th}$ layer, the rotational angle of the image portion passing through the respective mask subfield is corrected according to the measured rotational angle (relative to the $n^{th}$ layer); the deflection direction of each subfield image on the wafer is corrected according to the measured arrangement direction. As a result, the transfer subfields of the $(n+m)^{th}$ layer are accurately stitched together and accurately registered with corresponding portions of the $n^{th}$ layer.

The arrangement direction of each of multiple transfer subfields in the $n^{th}$ layer on the wafer 5 is measured; when projecting the $(n+m)^{th}$ layer, the deflection direction of each projected subfield image on the wafer is corrected according to the measured arrangement direction (in the $n^{th}$ layer). Also, when projecting the $(n+m)^{th}$ layer, the rotational angle of each image portion that has passed through the respective mask subfield can be measured (against the $n^{th}$ layer). Thus, accurate stitching and registration are achieved.

The yaw error can be measured as described above, and the deflection direction of each subfield image on the wafer can be corrected. The rotational angle of each such image can be corrected according to the measured yaw error, yielding accurate stitching and registration.

Whereas the invention has been described in connection with several example embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. In a microlithography process in which a charged-particle beam is passed sequentially through individual subfields of a segmented mask so as to projection-transfer a pattern defined by the mask subfield-by-subfield through a projection-optical system onto corresponding regions on a sensitive substrate, an improvement comprising: when projecting an image of a mask subfield, of a segmented mask defining an $(n+m)^{th}$-layer pattern, onto a corresponding transferred pattern of an $n^{th}$ layer on the sensitive substrate, (a) measuring a rotational angle of the image of the $(n+m)^{th}$ layer relative to the $n^{th}$-layer pattern, and (b) correcting at least one of (i) a rotational angle of the image of the mask subfield of the $(n+m)^{th}$ layer relative to the $n^{th}$ layer pattern, and (ii) a deflection direction of the image of the mask subfield of the $(n+m)^{th}$ layer relative to an orientation of the $n^{th}$-layer pattern.

2. A charged-particle-beam projection method, comprising:
   (a) providing a segmented mask in which a pattern defined by the mask is divided into multiple mask subfields;
   (b) sequentially irradiating the subfields of the mask using a charged-particle beam while moving the mask relative to a sensitive substrate, wherein the charged-particle beam, after passing through each mask subfield, is projected onto a corresponding transferred pattern on the sensitive substrate;
   (c) measuring a yaw error accompanying the relative movement of the mask and the sensitive substrate; and
   (d) according to the measured yaw error, correcting a direction of deflection of each mask-subfield image on the corresponding transferred pattern on the sensitive substrate.

3. The method of claim 2, including the step of correcting, according to the measured yaw error, a rotational angle of each mask-subfield image on the corresponding transferred pattern on the sensitive substrate.

4. In a microlithography process in which a charged-particle beam is passed sequentially through individual subfields of a segmented mask so as to projection-transfer a pattern, defined by the mask mounted on a movable mask stage, subfield-by-subfield through a projection-optical system onto corresponding regions on a sensitive substrate mounted on a movable substrate stage, an improvement comprising:
   (a) providing a mask comprising multiple subfields each defining a respective portion of an overall $(n+1)^{th}$-layer pattern defined by the mask, boundary regions separating the subfields from each other, and a transmissive alignment mark;
   (b) providing a substrate alignment mark on at least one of the substrate and the substrate stage;
   (c) moving the substrate as required to align the substrate alignment mark with an optical axis of the projection-optical system;

(d) moving the mask as required to position the alignment mark on the mask sequentially on the optical axis, and irradiating the positioned alignment mark onto the substrate alignment mark; and (e) measuring a position error of an image of the mask alignment mark relative to the substrate alignment mark.

5. The process of claim 4, further comprising the step, after step (e), of correcting the position error before exposing a mask subfield using the charged particle beam.

6. The process of claim 5, wherein the step of correcting the position error comprises deflecting the charged particle beam.

7. The process of claim 4, wherein the substrate alignment mark is located on the substrate and was formed during formation of an $n^{th}$ layer on the substrate.

8. The method of claim 4, wherein:

in step (b), the substrate is provided with multiple substrate alignment marks;

step (d) comprises irradiating an image of a mask alignment mark on a substrate alignment mark; and step (e) comprises measuring a relative rotation of the substrate alignment mark and the irradiated mask alignment mark.

9. The process of claim 8, further comprising the step of correcting an error of rotation of the substrate alignment mark relative to the irradiated mask alignment mark.

10. The process of claim 9, wherein the error is corrected by moving the substrate stage.

11. A mask for projection lithography of a sensitive substrate using a charged-particle beam, comprising:

(a) multiple subfields each defining a respective portion of an overall pattern defined by the mask;

(b) boundary regions separating the subfields from each other; and (c) a measurement subfield separate from the subfields defining respective pattern portions, the measurement subfield having a profile comprising multiple sides, wherein a respective rotational-angle-measurement mark is located adjacent each side.

12. A mask for projection lithography of a sensitive substrate using a charged-particle beam, comprising:

(a) a pattern field having a profile comprising first and second opposing sides, the pattern field comprising multiple subfields each defining a respective portion of an overall pattern defined by the mask;

(b) boundary regions separating the subfields from each other in the pattern field; and (c) a first transmissive alignment-direction-measurement mark located outside the pattern field adjacent the first side; and (d) a second transmissive alignment-direction-measurement mark located outside the pattern field adjacent the second side.

13. The mask of claim 12, further comprising a measurement subfield located within the pattern field but separate from the subfields defining respective pattern portions, the measurement subfield having a profile comprising multiple sides, wherein a respective rotational-angle-measurement mark is located adjacent each side.

* * * * *

UNITED STATES PATENT AND TRADEMARK OFFICE
CERTIFICATE OF CORRECTION

PATENT NO. : 6,072,184
DATED : June 6, 2000
INVENTOR(S) : Teruaki Okino and Shohei Suzuki It is certified that error appears in the above-identified patent and that said Letters Patent is hereby corrected as shown below:

In the specification:

Column 12,
Line 42, delete the word "use".
Lines 49-50, "mark detection" should read -- mark-detection --.

Claim 8 , column 15,
Line 17, "The method of" should read -- The process of --.

Signed and Sealed this

Eleventh Day of September, 2001

Attest:

NICHOLAS P. GODICI
Attesting Officer
Acting Director of the United States Patent and Trademark Office